United States Patent
Hsu et al.

(10) Patent No.: US 9,887,102 B2
(45) Date of Patent: Feb. 6, 2018

(54) METHOD FOR MANUFACTURING MULTI-CHIP PACKAGE

(71) Applicant: Siliconware Precision Industries Co., Ltd., Taichung (TW)

(72) Inventors: Tai-Tsung Hsu, Taichung (TW);
Cheng-Yu Chiang, Tauchung (TW);
Miao-Wen Chen, Taichung (TW);
Wen-Jung Chiang, Taichung (TW);
Hsin-Hung Lee, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/054,845

(22) Filed: Feb. 26, 2016

(65) Prior Publication Data
US 2016/0181126 A1 Jun. 23, 2016

Related U.S. Application Data

(62) Division of application No. 13/960,064, filed on Aug. 6, 2013, now Pat. No. 9,305,885.

(30) Foreign Application Priority Data

Feb. 21, 2013 (TW) .............................. 102105957 A

(51) Int. Cl.
*H01L 21/56* (2006.01)
*H01L 23/36* (2006.01)
(Continued)

(52) U.S. Cl.
CPC ............ *H01L 21/56* (2013.01); *H01L 21/428* (2013.01); *H01L 23/3121* (2013.01); *H01L 23/36* (2013.01); *H01L 23/3675* (2013.01); *H01L 23/552* (2013.01); *H01L 23/585* (2013.01); *H01L 21/565* (2013.01);
(Continued)

(58) Field of Classification Search
CPC ..... H01L 21/56; H01L 23/585; H01L 21/428; H01L 23/3675; H01L 23/36; H01L 23/3121; H01L 23/552; H01L 2924/1815; H01L 2224/48227; H01L 2224/16225; H01L 21/565; H01L 25/0655
USPC ........ 438/122, 109, 106, 125; 257/778, 666, 257/98, 659, 737, 686
See application file for complete search history.

(56) References Cited

U.S. PATENT DOCUMENTS 4,857,698 A * 8/1989 Perun ...................... B64C 23/00
219/121.71
2008/0032457 A1 2/2008 McWilliams et al.
(Continued)

*Primary Examiner* — Moin Rahman
(74) *Attorney, Agent, or Firm* — Mintz Levin Cohn Ferris Glovsky and Popeo, P.C.; Peter F. Corless; Steven M. Jensen

(57) ABSTRACT

A multi-chip package structure is provided, including a substrate having a grounding structure; two semiconductor elements disposed on and electrically connected to the substrate; an encapsulant formed on the substrate and encapsulating semiconductor elements, wherein the encapsulant has a plurality of round holes formed between the semiconductor elements; and an electromagnetic shielding structure formed in each of the round holes and connected to the grounding structure to achieve electromagnetic shielding effects. A method for forming the multi-chip package is also provided.

10 Claims, 5 Drawing Sheets

(51) Int. Cl.
*H01L 23/552* (2006.01)
*H01L 23/31* (2006.01)
*H01L 21/428* (2006.01)
*H01L 23/367* (2006.01)
*H01L 23/58* (2006.01)
*H01L 25/065* (2006.01)

(52) U.S. Cl.
CPC .................. *H01L 25/0655* (2013.01); *H01L 2224/16225* (2013.01); *H01L 2224/48227* (2013.01); *H01L 2924/1815* (2013.01)

(56) References Cited

U.S. PATENT DOCUMENTS

| | | |
|---|---|---|
| 2010/0140771 A1 | 6/2010 | Huang et al. |
| 2010/0327438 A1 | 12/2010 | Fryklund et al. |
| 2011/0042800 A1* | 2/2011 | Hsu .................. H01L 23/5389 257/698 |
| 2012/0235259 A1* | 9/2012 | Fang .................. H01L 21/561 257/428 |

* cited by examiner

METHOD FOR MANUFACTURING MULTI-CHIP PACKAGE

CROSS-REFERENCE TO RELATED APPLICATIONS

This application is a divisional of copending application U.S. Ser. No. 13/960,064, filed on Aug. 6, 2013, which claims under 35 U.S.C. §119(a) the benefit of Taiwanese Application No. 102105957, filed Feb. 21, 2013, the entire contents of which are incorporated herein by reference.

BACKGROUND OF THE INVENTION

1. Field of the Invention

The present invention relates to semiconductor package structures, and, more particularly, to a multi-chip package and a method for manufacturing the same.

2. Description of Related Art

With the development of the electronic industry, electronic products at the market have demands for light weights, compact sizes, high speeds, and multifunctions. Therefore, a multi-chip package inside the product develops toward to a high computation speed, high component density, and high complexity, and further integrates other electronic components having multifunctions such as biology, optics, mechanics, electronics, and magnetics in one package.

In order to accord with the trend of a low-profiled and compact-sized multi-chip package, system in package (SiP) thus develops a multi-chip module (MCM) package structure. However, this structure increases the density of components and causes the electromagnetic interference (EMI) between chips disposed on the same substrate.

For preventing the EMI between chips, presently the industry develops a multi-chip package having an electromagnetic shielding function. As shown in FIGS. 1A and 1B, a conventional multi-chip package 1 having an electromagnetic shielding function comprises: a substrate 10 having two semiconductor elements 11a and 11b disposed thereon and electrically connected thereto, an encapsulant 12 formed on the substrate 10, a long trench 120 formed in the encapsulant 12 and formed between the two semiconductor elements 11a and 11b, and an electromagnetic shield 13 formed in the long trench 120 and electrically connected to a grounding structure 100 of the substrate 10. In addition, a plurality of electromagnetic shield bars 13' are formed in the encapsulant 12, as shown in FIG. 1B'.

However, the conventional long trench 120 is formed by a laser method, and the encapsulant 12 will be overheated if the laser is performed for a long time, causing damages of the semiconductor elements 11a and 11b or a warpage of the encapsulant 12.

Further, it takes long time to form the long trench 120, which causes an increase of the manufacturing cost.

Therefore, how to overcome the mentioned problems of the prior art is substantially an issue desirably to be solved.

SUMMARY OF THE INVENTION

In view of the above-mentioned problems of the prior art, the present invention provides a multi-chip package, comprising: a substrate having a grounding structure; two semiconductor elements disposed on and electrically connected to the substrate; an encapsulant formed on the substrate and encapsulating the semiconductor elements, wherein the encapsulant has a plurality of round holes formed between the semiconductor elements; and an electromagnetic shielding structure formed in each of the round holes and connected to the grounding structure.

The present invention further provides a method for manufacturing a multi-chip package, comprising: forming an encapsulant on a substrate having two semiconductor elements disposed thereon such that the semiconductor elements are embedded in the encapsulant, wherein the substrate has a grounding structure; forming a plurality of round holes disposed between the semiconductor elements and penetrating the encapsulant; and forming an electromagnetic shielding structure in each of the round holes and connecting the electromagnetic shielding structure to the grounding structure.

The present invention further provides a multi-chip package, comprising: a substrate having a grounding layer; two semiconductor elements disposed on and electrically connected to the substrate; an encapsulant, formed on the substrate and encapsulating the semiconductor elements, wherein the encapsulant has a plurality of round holes disposed between the semiconductor elements and penetrating the encapsulant and substrate; and an electromagnetic shielding structure formed in each of the round holes and connected to the grounding layer.

The present invention further provides a method for manufacturing a multi-chip package, comprising: forming an encapsulant on a substrate having two semiconductor elements disposed thereon such that the semiconductor elements are embedded in the encapsulant, wherein the substrate has a grounding layer; forming a plurality of round holes disposed between the semiconductor elements and penetrating the encapsulant and substrate; and forming an electromagnetic shielding structure in each of the round holes and connecting the electromagnetic shielding structure to the grounding layer.

In an embodiment, the round holes are formed by a laser drilling method.

In an embodiment, the methods further comprise forming a strip hole in the encapsulant, wherein the strip hole and the round hole are spaced at an interval, and the electromagnetic shielding structure is further formed in the strip hole.

In an embodiment, the methods further comprise forming a heat dissipating element on the encapsulant, and thus the multi-chip package has a better effect of heat dissipation.

From the above, the multi-chip packages and the methods for manufacturing the same of the present invention shorten the time of the laser drilling by forming round holes, and avoid drawbacks such as an overheated encapsulant, a warpage or a damage of the semiconductor caused by a long processing time.

Moreover, compared with the conventional long trench, the round holes of the present invention have a process with shorter time, and thus reduce the manufacturing cost.

Furthermore, because a heat dissipating element is disposed on the encapsulant of the multi-chip package of the present invention, the electromagnetic shielding structure of the present invention can not only provide an effect of electromagnetic shielding, but also effectively transmit heat generated during the operation of a semiconductor to a heat dissipating element to provide an excellent heat dissipation effect for the multi-chip package of the present invention.

BRIEF DESCRIPTION OF DRAWINGS

The invention can be more fully understood by reading the following detailed description of the preferred embodiments, with reference made to the accompanying drawings, wherein:

FIGS. 1A and 1B' are schematic views of a multi-chip package according to the prior art, wherein FIG. 1B is a top view of FIG. 1A, and FIG. 1B' is a top view of another pattern of FIG. 1A;

DETAILED DESCRIPTION OF THE INVENTION

The following illustrative embodiments are provided to illustrate the disclosure of the present invention, these and other advantages and effects can be apparently understood by the in the art after reading the disclosure of this specification. The present invention can also be performed or applied by other different embodiments. The details of the specification may be on the basis of different points and applications, and numerous modifications and variations can be devised without departing from the spirit of the present invention.

It should be advised that the structure, ratio, and size as illustrated in this context are only used for disclosures of this specification, provided for persons skilled in the art to understand and read, and technically do not have substantial meaning. Any modification of the structure, change of the ratio relation, or adjustment of the size should be involved in the scope of disclosures in this specification without influencing the producible efficacy and the achievable objective of this specification. Also, the referred terms such as "on", "one" and "two" in this specification are only for the convenience to describe, not for limiting the scope of embodiment in the present invention. The changes or adjustments of relative relationship without substantial change of technical content should also be considered within the category of implementation.

Figure 1A:
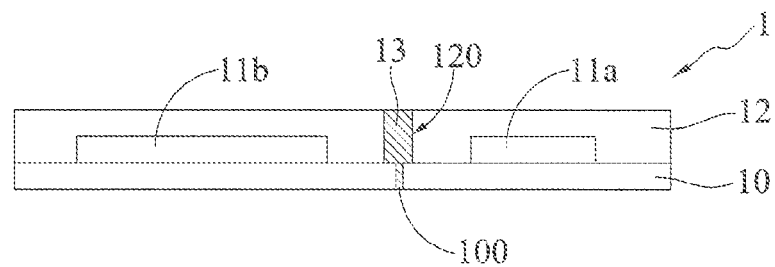
Figure 1B:
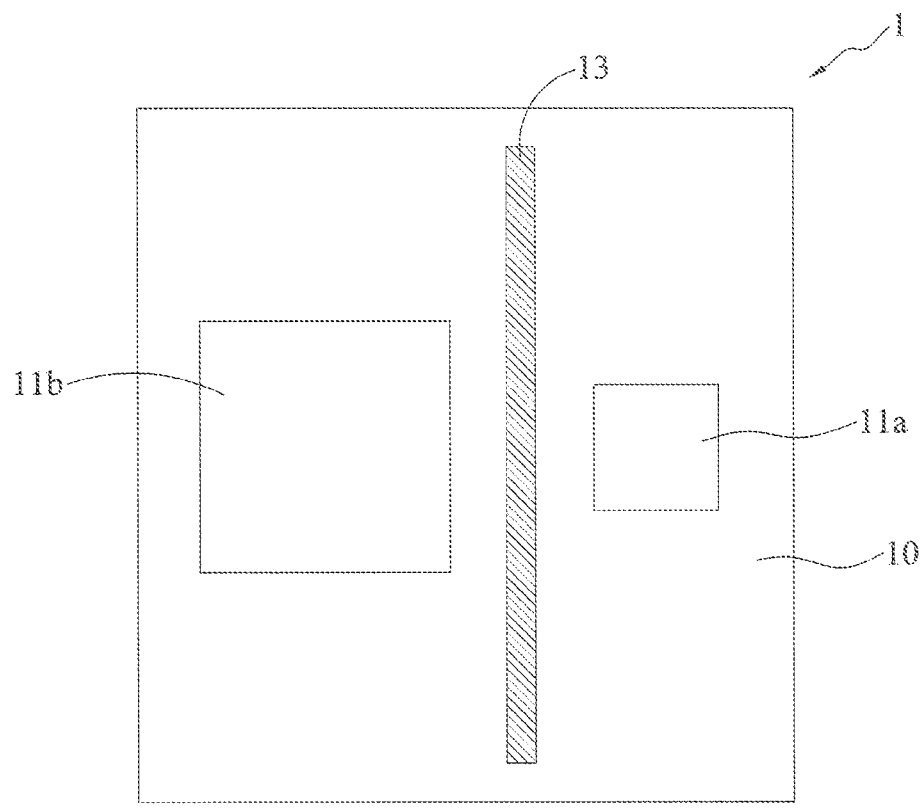
Figure 1B:
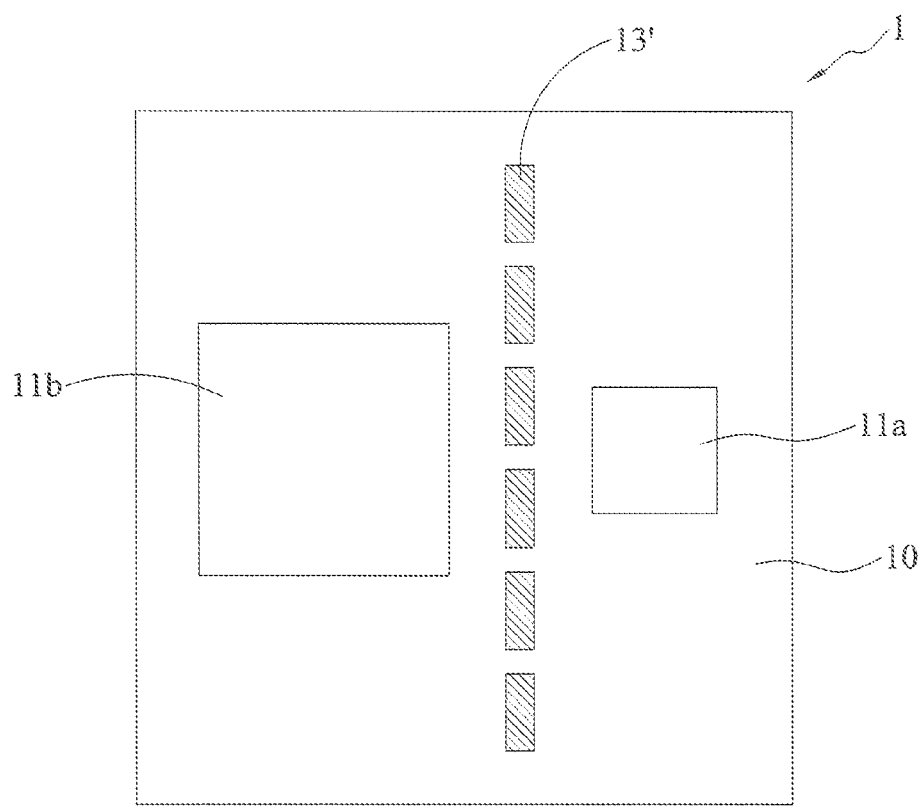
Figure 2A:
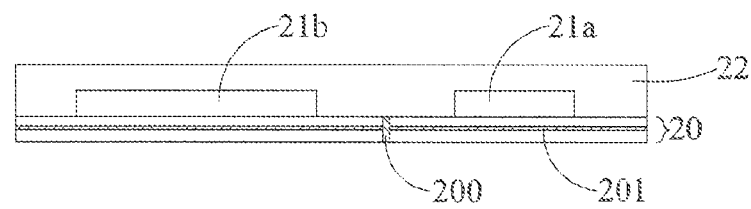
FIGS. 2A-2C are cross-sectional views illustrating a method for manufacturing a multi-chip package according to the present invention, wherein FIG. 2B' is a top view of FIG. 2B, and FIG. 2B" is another embodiment of FIG. 2B'.
Figure 2B:
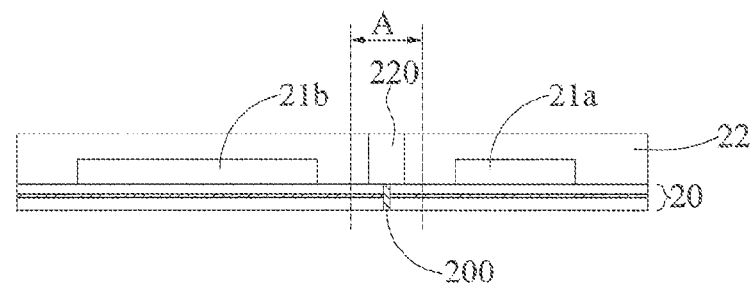
Figure 2B:
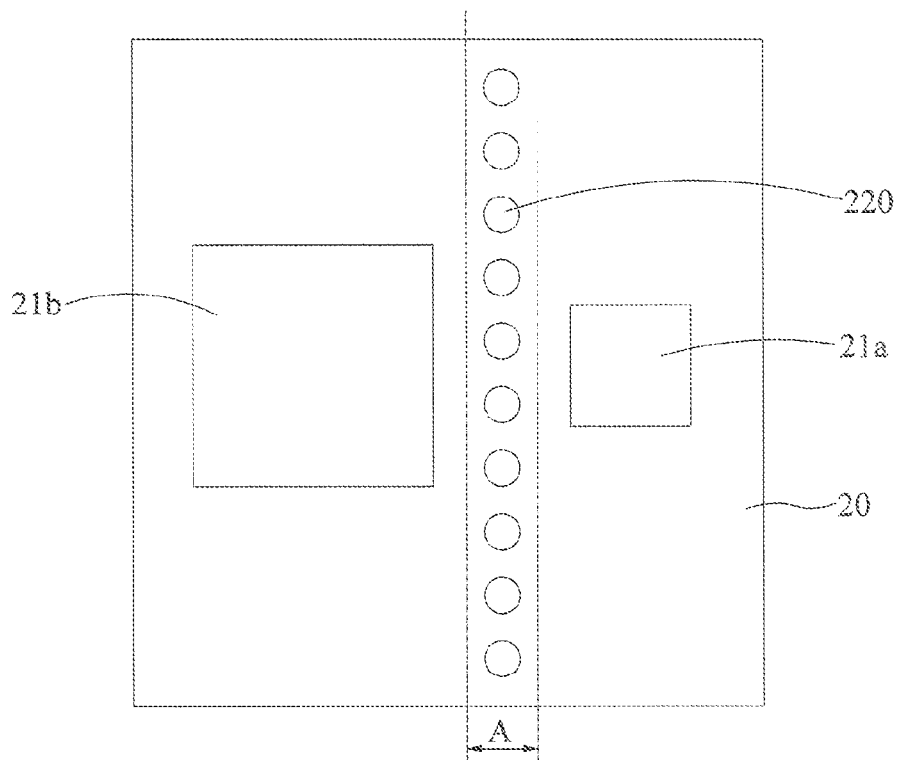
Figure 2B:
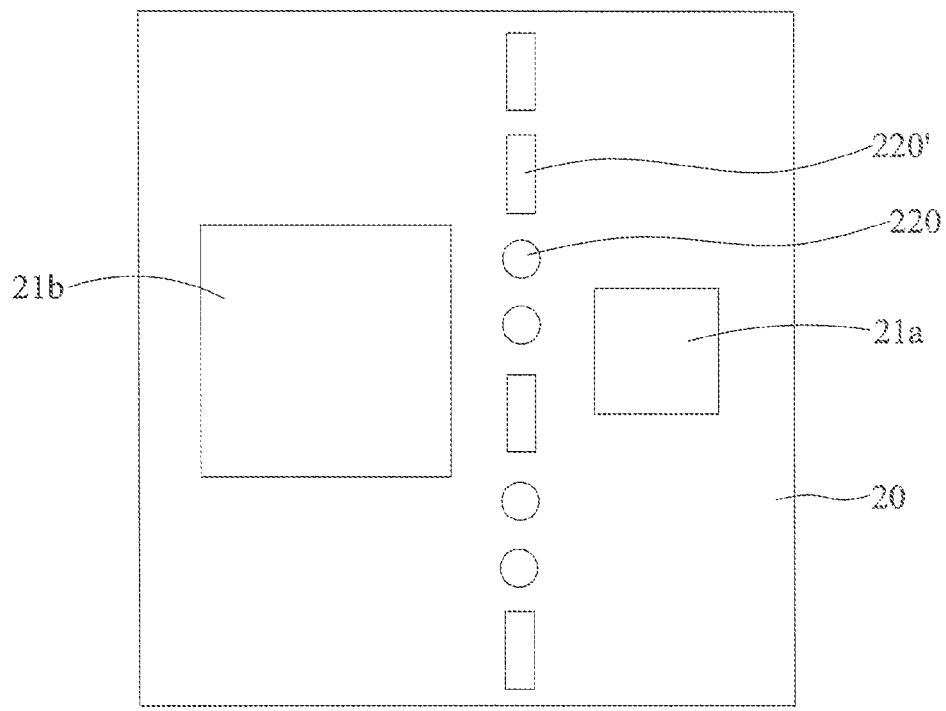
Figure 2C:
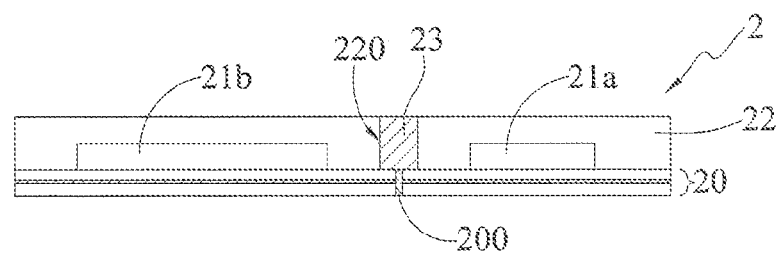

FIGS. 2A-2C are cross-sectional views illustrating a method for manufacturing a multi-chip package according to the present invention.

As shown in FIG. 2A, a substrate 20 having two semiconductor elements 21a and 21b disposed thereon and electrically connected thereto is provided, and an encapsulant 22 is formed on the substrate 20 and encapsulating the semiconductor elements 21a and 21b such that the semiconductor elements 21a and 21b are embedded in the encapsulant 22.

In an embodiment, the substrate 20 has a grounding structure 200 and a grounding layer 201 connected to the grounding structure 200, and the semiconductor elements 21a and 21b are chips.

Moreover, there are various types of the substrate 20 that are well-known by persons skilled in the art, further description hereby omitted.

Furthermore, the encapsulant 22 is also well-known by persons skilled in the art, further description hereby omitted.

In an embodiment, the semiconductor elements 21a and 21b are electrically connected to the substrate 20 by, but not limited to, bonding wires (not illustrated) or conductive bumps (not illustrated).

As shown in FIGS. 2B and 2B', a plurality of round holes 220 penetrating the encapsulant 22 are formed between the semiconductor elements 21a and 21b, and at least one of the round holes 220 exposes the grounding structure 200.

In an embodiment, an intersectional region A is defined between the semiconductor elements 21a and 21b. The round holes 220 are formed in the intersectional region A by the laser, and the round holes 220 are spaced apart from one another.

In another embodiment, a plurality of strip holes 220' are formed in the intersectional region A of the encapsulant 22, and are spaced from the round hole at an interval, as shown in FIG. 2B".

Moreover, no specific limitation is placed on the order of forming the round holes 220 and strip holes 220'. Preferably, the round holes 220 are formed after the formation of the strip holes 220'.

Furthermore, no specific limitation is placed on the method of forming the round holes 220 and strip holes 220'. For example, a regular laser drilling method satisfies the requirement.

Because the method of the present invention does not apply a continuous cutting method, the warpage issue occurred when the encapsulant 22 is overheated during the laser drilling can be prevented. The drawback of the increasing manufacturing cost caused by the defects due to an occurrence of a damage can therefore be prevented.

As shown in FIG. 2C, which continues the process of FIGS. 2B and 2B', an electromagnetic shielding structure 23 is formed in each of the round holes 220, and is connected to a grounding structure 200 of the substrate 20 to manufacture a multi-chip package 2.

In an embodiment, the electromagnetic shielding structure 23 is made of a conductive paste containing metal, copper or solder. The electromagnetic shielding structure 23 is electrically connected to the grounding structure 200 of the substrate 20 for shielding and protecting the semiconductor elements 21a and 21b from being affected by the EMI, to achieve the effect of electromagnetic shielding.

In an embodiment, the process of FIG. 2B" is continued, and the electromagnetic shielding structures 23 are further formed in the strip holes 220', and are thus electrically connected to the grounding structure 200 or the grounding layer 201.

A multi-chip package 2 according to the present invention comprises a substrate 20 having a grounding structure 200, two semiconductor elements 21a and 21b disposed on and electrically connected to the substrate 20, an encapsulant 22 formed on the substrate 20 and encapsulating the semiconductor elements 21a and 21b, a plurality of round holes 220 disposed between the semiconductor elements 21a and 21b, formed in the encapsulant 22 and exposing the grounding structure 200, and an electromagnetic shielding structure 23 formed in each of the round holes 220 and connected to the grounding structure 200.

Figure 3:
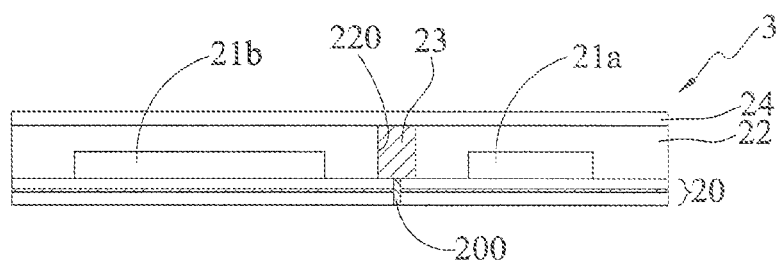
FIG. 3 is a cross-sectional view of another embodiment of a multi-chip package according to the present invention.

FIG. 3 is another embodiment of a multi-chip package 3 according to the present invention. A heat dissipating element 24 is formed by forming a metal film using a plating method or by attaching a metal sheet on the encapsulant 22, and is effective to dissipate the heat generated during the operation of the semiconductor elements 21a and 21b.

In an embodiment, the electromagnetic shielding structure 23 formed in each of the round holes 220 is connected to the heat dissipating element 24.

Since being made of a conductive paste containing metal, copper, or solder, the electromagnetic shielding structure 23 has a well heat conductivity and can effectively transmit the heat to the heat dissipating element 24. Therefore, a good effect of heat dissipation for the multi-chip package 3 is achieved.

Figure 4:
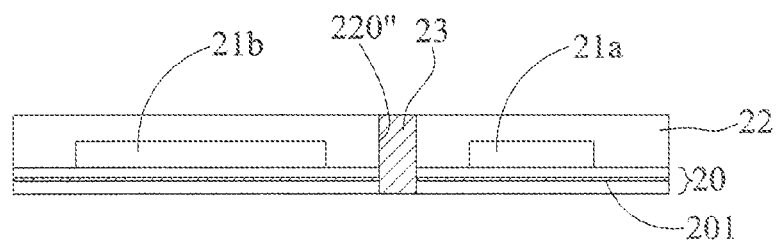
FIG. 4 is a cross-sectional view of another embodiment of a multi-chip package according to the present invention.

FIG. 4 is another embodiment of a multi-chip package according to the present invention. A round hole 220″ penetrates the encapsulant 22 and the substrate 20 and is directly connected to a grounding layer 201 of the substrate 20.

In summary, with a design of forming an electromagnetic shielding structure in a round hole, the multi-chip package and method for manufacturing the same according to the present invention not only speed up the process and reduce the manufacturing cost, but also overcome drawbacks of the prior art, such as a warpage of the encapsulant or a damage of the chip.

The foregoing descriptions of the detailed embodiments are only illustrated to disclose the features and functions of the present invention and not restrictive of the scope of the present invention. It should be understood to the in the art that all modifications and variations according to the spirit and principle in the disclosure of the present invention should fall within the scope of the appended claims.

What is claimed is:

1. A method for manufacturing a multi-chip package, comprising:
    forming an encapsulant on a substrate having two semiconductor elements disposed thereon such that the semiconductor elements are embedded in the encapsulant, wherein the substrate has a grounding structure and a grounding layer, and wherein the grounding layer extends to the grounding structure and connects vertically to the grounding structure;
    forming a plurality of round holes disposed between the semiconductor elements and penetrating the encapsulant; and
    forming an electromagnetic shielding structure in each of the round holes and connecting the electromagnetic shielding structure to the grounding structure, wherein the electromagnetic shielding structure is free from contacting the semiconductor elements.

2. The method of claim 1, further comprising forming at least one strip hole in the encapsulant, and the at least one strip hole and the round hole are spaced at an interval.

3. The method of claim 2, wherein the electromagnetic shielding structure is further formed in the at least one strip hole.

4. The method of claim 1, further comprising forming a heat dissipating element on the encapsulant.

5. The method of claim 1, wherein the round holes are formed by a laser drilling method.

6. A method for manufacturing a multi-chip package, comprising:
    forming an encapsulant on a substrate having two semiconductor elements disposed thereon such that the semiconductor elements are embedded in the encapsulant, wherein the substrate has a grounding structure and a grounding layer, and wherein the grounding layer extends to the grounding structure and connects vertically to the grounding structure;
    forming a plurality of round holes disposed between the semiconductor elements and penetrating the encapsulant and the substrate; and
    forming an electromagnetic shielding structure in each of the round holes and connecting the electromagnetic shielding structure to the grounding layer, wherein the electromagnetic shielding structure is free from contacting the semiconductor elements.

7. The method of claim 6, further comprising forming at least one strip hole in the encapsulant, and the at least one strip hole and the round hole are spaced at an interval.

8. The method of claim 7, wherein the electromagnetic shielding structure is further formed in the at least one strip hole.

9. The method of claim 6, further comprising forming a heat dissipating element on the encapsulant.

10. The method of claim 6, wherein the round holes are formed by a laser drilling method.

* * * * *